United States Patent
Song et al.

(10) Patent No.: US 9,426,591 B2
(45) Date of Patent: Aug. 23, 2016

(54) PORTABLE TERMINAL AND SOUND DETECTOR, WHICH BOTH COMMUNICATE USING BODY AREA NETWORK, AND DATA CONTROLLING METHOD THEREFOR

(75) Inventors: Jong-keun Song, Yongin-si (KR); Dong-wook Kim, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 489 days.

(21) Appl. No.: 12/695,690

(22) Filed: Jan. 28, 2010

(65) Prior Publication Data

US 2010/0189272 A1 Jul. 29, 2010

(30) Foreign Application Priority Data

Jan. 28, 2009 (KR) ........................ 10-2009-0006612

(51) Int. Cl.
| | | |
|---|---|---|
| *H04R 29/00* | (2006.01) | |
| *H04M 1/60* | (2006.01) | |
| *H04B 13/00* | (2006.01) | |
| *H04R 25/00* | (2006.01) | |
| *H04W 4/00* | (2009.01) | |
| *H04B 1/00* | (2006.01) | |
| *G06F 3/16* | (2006.01) | |
| *H03G 5/00* | (2006.01) | |

(52) U.S. Cl.
CPC .............. *H04R 29/00* (2013.01); *H04B 13/005* (2013.01); *H04M 1/6058* (2013.01); *G06F 3/16* (2013.01); *H03G 5/00* (2013.01); *H04B 1/00* (2013.01); *H04R 25/50* (2013.01); *H04R 25/558* (2013.01); *H04R 2225/00* (2013.01); *H04W 4/008* (2013.01)

(58) Field of Classification Search
CPC .............. H04B 1/48; H04B 1/50; H04B 1/54; H04R 2225/00; H04R 25/558; H04R 25/50; G06F 3/16; H03G 5/00; H04W 4/008
USPC ......... 381/55, 56, 58, 59, 397, 315, 312, 323; 455/78–83, 193.1, 193.2, 195.1, 197.3
See application file for complete search history.

(56) References Cited

U.S. PATENT DOCUMENTS

| | | | | |
|---|---|---|---|---|
| 5,303,306 A | * | 4/1994 | Brillhart et al. ............... | 381/315 |
| 7,020,296 B2 | * | 3/2006 | Niederdrank ................. | 381/315 |
| 7,076,077 B2 | * | 7/2006 | Atsumi et al. ................ | 381/380 |
| 7,177,595 B2 | * | 2/2007 | Hamada et al. ............. | 455/41.2 |
| 7,382,760 B2 | * | 6/2008 | Slamka et al. ................ | 370/338 |
| 7,620,433 B2 | * | 11/2009 | Bodley ...................... | 455/575.2 |
| 7,903,825 B1 | * | 3/2011 | Melanson ....................... | 381/57 |
| 7,986,802 B2 | * | 7/2011 | Ziller ............................ | 381/334 |
| 8,150,475 B2 | * | 4/2012 | Gilmore et al. ............... | 455/572 |

(Continued)

FOREIGN PATENT DOCUMENTS

WO WO 2009135872 A1 * 11/2009

OTHER PUBLICATIONS

Audio Video WG, Audio Video Remote control profile, 2007.*

(Continued)

*Primary Examiner* — Davetta W Goins
*Assistant Examiner* — Kuassi Ganmavo
(74) *Attorney, Agent, or Firm* — Cantor Colburn LLP

(57) ABSTRACT

A sound detector communicates with a portable terminal by manipulation of the portable terminal by a user and may reproduce data communicated between the sound detector and the portable terminal.

32 Claims, 9 Drawing Sheets

(56) References Cited

U.S. PATENT DOCUMENTS

| | | | |
|---|---|---|---|
| 8,190,203 B2* | 5/2012 | Pelland et al. | 455/556.1 |
| 8,503,935 B2* | 8/2013 | Kim | 455/41.2 |
| 8,600,301 B2* | 12/2013 | Kim | 455/41.2 |
| 2003/0035551 A1* | 2/2003 | Light et al. | 381/71.6 |
| 2006/0083388 A1* | 4/2006 | Rothschild | 381/81 |
| 2006/0135218 A1* | 6/2006 | Son et al. | 455/573 |
| 2006/0252371 A1* | 11/2006 | Yanagida | 455/41.1 |
| 2006/0274747 A1* | 12/2006 | Duchscher et al. | 370/389 |
| 2007/0127747 A1* | 6/2007 | Doyle | 381/309 |
| 2007/0255435 A1* | 11/2007 | Cohen et al. | 700/94 |
| 2007/0269065 A1* | 11/2007 | Kilsgaard | 381/315 |
| 2008/0049945 A1* | 2/2008 | Haenggi | H04R 25/552 381/26 |
| 2008/0049957 A1* | 2/2008 | Topholm | 381/315 |
| 2008/0101638 A1 | 5/2008 | Ziller | |
| 2008/0259043 A1* | 10/2008 | Buil et al. | 345/173 |
| 2009/0074203 A1* | 3/2009 | Bradford et al. | 381/94.2 |
| 2009/0196443 A1* | 8/2009 | Her et al. | 381/315 |
| 2010/0119077 A1* | 5/2010 | Platz et al. | 381/72 |
| 2010/0128906 A1* | 5/2010 | Haenggi | H04R 25/558 381/315 |
| 2010/0158292 A1* | 6/2010 | Pedersen | H04R 25/55 381/315 |
| 2010/0254551 A1* | 10/2010 | Aoki et al. | 381/312 |
| 2010/0272272 A1* | 10/2010 | Muller | H04R 25/305 381/60 |

OTHER PUBLICATIONS

Japanese Office Action for Japanese Patent Application No. 2011-547794 dated Feb. 9, 2016.
Korean Office Action for Korean Patent Application No. 10-2010-0008050 dated Feb. 5, 2016.

* cited by examiner

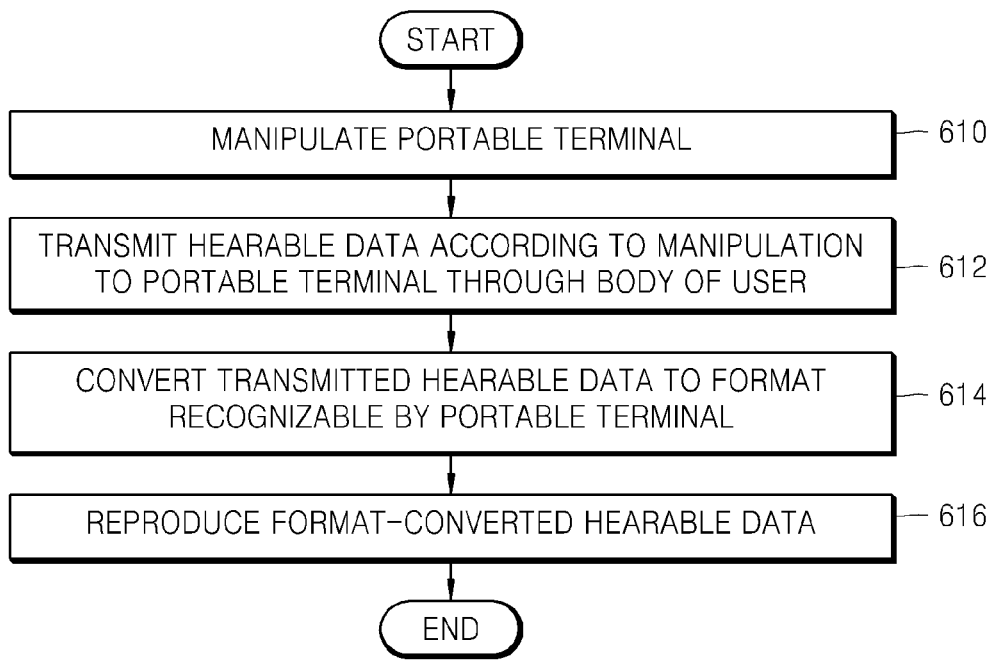
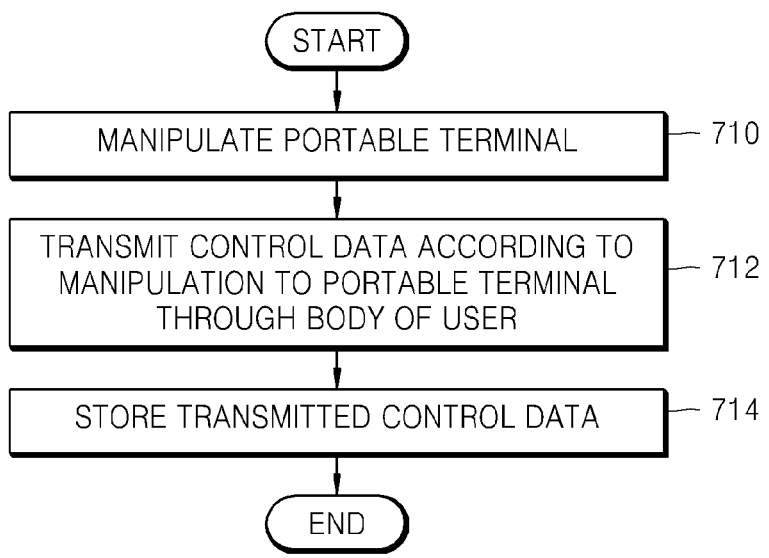

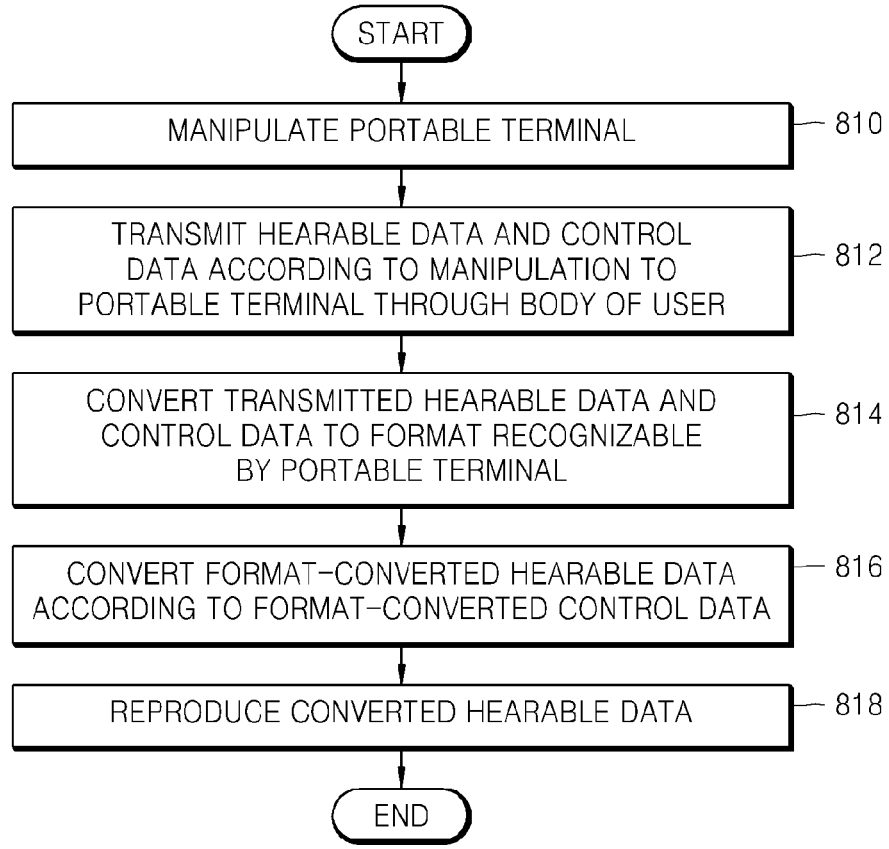
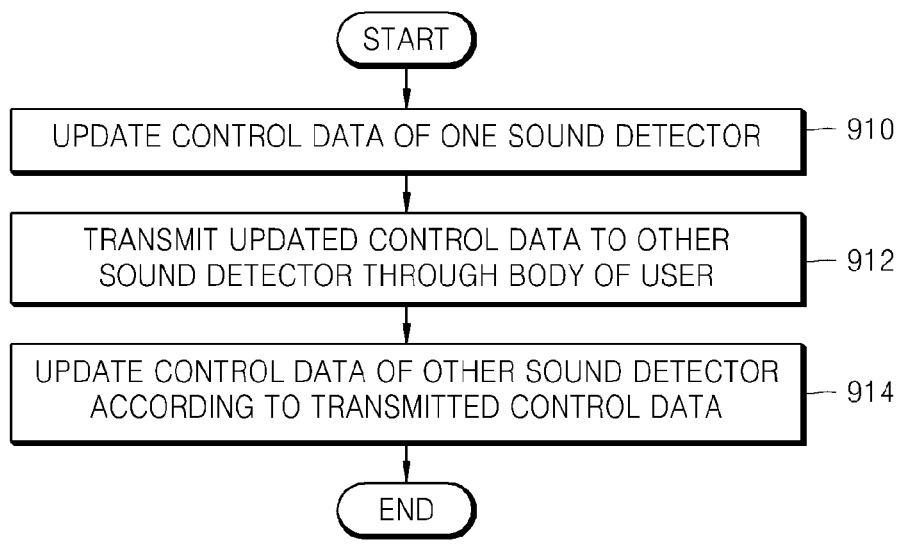

PORTABLE TERMINAL AND SOUND DETECTOR, WHICH BOTH COMMUNICATE USING BODY AREA NETWORK, AND DATA CONTROLLING METHOD THEREFOR

CROSS-REFERENCE TO RELATED APPLICATION

This application claims priority to Korean Patent Application No. 10-2009-0006612, filed on Jan. 28, 2009, and all the benefits accruing therefrom under 35 U.S.C. §119, the content of which in its entirety is herein incorporated by reference.

BACKGROUND

1) Field

The general inventive concept relates to a sound detector. More particularly, the general inventive concept relates to a sound detector, such as a hearing aid or a headset that is worn on a user's ears, a portable terminal manipulated by the user, and a method of controlling data for the sound detector and the portable terminal.

2) Description of the Related Art

Portable terminals, such as mobile phones, moving picture expert group ("MPEG") audio layer 3 ("MP3") players and portable multimedia players ("PMPs"), for example, use headsets that are connected by a wire to the portable terminal. In addition, hearing aids are becoming more widely used with portable terminals, to which the hearing aid is connected by a wire.

As the use of headsets and/or hearing aids with portable terminals becomes more popular, there is an increasing need to improve performance of these devices, such as by increasing communication efficiency between the devices, improving a sound quality of the devices, and in various other regards, such as reducing the size, number of components (such as wires, for example) and/or power requirements of the devices.

SUMMARY

Provided is a portable terminal that efficiently communicates with a sound detector, and a method for controlling a sound detector.

Provided is a sound detector system, in which a first sound detector efficiently communicates with a second sound detector, and a method for controlling data between the first sound detector and the second sound detector.

Provided is a method for determining hearable data reproduced in a sound detector which communicates with a portable terminal, and a sound reproducing system.

To achieve the above and/or other aspects, a sound detector which communicates with a portable terminal, the sound detector including: a sound detector side transmitter/receiver which communicates with the portable terminal according to a manipulation of the portable terminal by a user; a sound detector side controller connected to the sound detector side transmitter/receiver; and a sound detector side reproducing unit connected to the sound detector side controller and which reproduces data received from the sound detector side controller, wherein the sound detector side transmitter/receiver communicates with the portable terminal using a body area network (BAN) of the user.

To achieve the above and/or other aspects, a method of controlling a sound detector, the method includes: receiving control data, which controls the sound detector, from a portable terminal according to a manipulation of the portable terminal by a user by using a body area network (BAN); and setting the sound detector based on the received control data.

To achieve the above and/or other aspects, a computer readable recording medium having stored thereon a computer program for executing the method of controlling a sound detector.

To achieve the above and/or other aspects, a sound detector system includes: a first sound detector including: a sound detector side controller; a sound detector side transmitter/receiver; and a sensing unit which senses hearable data; and a second sound detector, wherein the sound detector side controller updates control data of the first sound detector according to the hearable data sensed by the sensing unit to generate updated control data, and the sound detector side transmitter/receiver communicates the updated control data to the second sound detector using a body area network (BAN) of a user.

To achieve the above and/or other aspects, a method of controlling data of a sound detector system including a first sound detector and a second sound detector, the method includes: sensing hearable data from outside the first sound detector and the second sound detector to generate sensed hearable data; updating control data of the first sound detector according to the sensed hearable data to generate updated control data; and transmitting the updated control data to the second sound detector using a body area network (BAN) of a user.

To achieve the above and/or other aspects, a computer readable recording medium having stored thereon a computer program for executing the method of controlling data of a sound detector system including a first sound detector and a second sound detector.

To achieve the above and/or other aspects, a method of determining hearable data reproduced in a sound detector which communicates with a portable terminal, the method including: sensing first hearable data in the sound detector from outside of the sound detector; determining a reproduction mode for reproducing at least one of the first hearable data and second hearable data previously stored in the portable terminal or received from the outside of the portable terminal in correspondence to a manipulation of the portable terminal by a user.

To achieve the above and/or other aspects, a sound reproducing system including: a sound detector for sensing first hearable data from outside; and a portable terminal for determining a reproduction mode for reproducing at least one of the first hearable data and second hearable data previously stored in the portable terminal or received from outside of the portable terminal in correspondence to manipulation of the portable terminal by a user and transmitting a control data according to the determined reproduction mode to the sound detector by using a body area network (BAN), wherein the sound detector reproduces at least one of the first hearable data and the second hearable data by referring to the control data received in the sound detector.

To achieve the above and/or other aspects, a computer readable recording medium having stored thereon a computer program for executing the method of determining hearable data reproduced in a sound detector which communicates with a portable terminal.

BRIEF DESCRIPTION OF THE DRAWINGS

The above and/or other aspects of the general inventive concept will become more readily apparent and more readily appreciated by describing in further detail examples of embodiments thereof, taken in conjunction with the accompanying drawings, in which:

FIGS. 3 through 9 are flowcharts illustrating example embodiments of methods of controlling data between a portable terminal and a sound detector;

DETAILED DESCRIPTION

Figure 1:
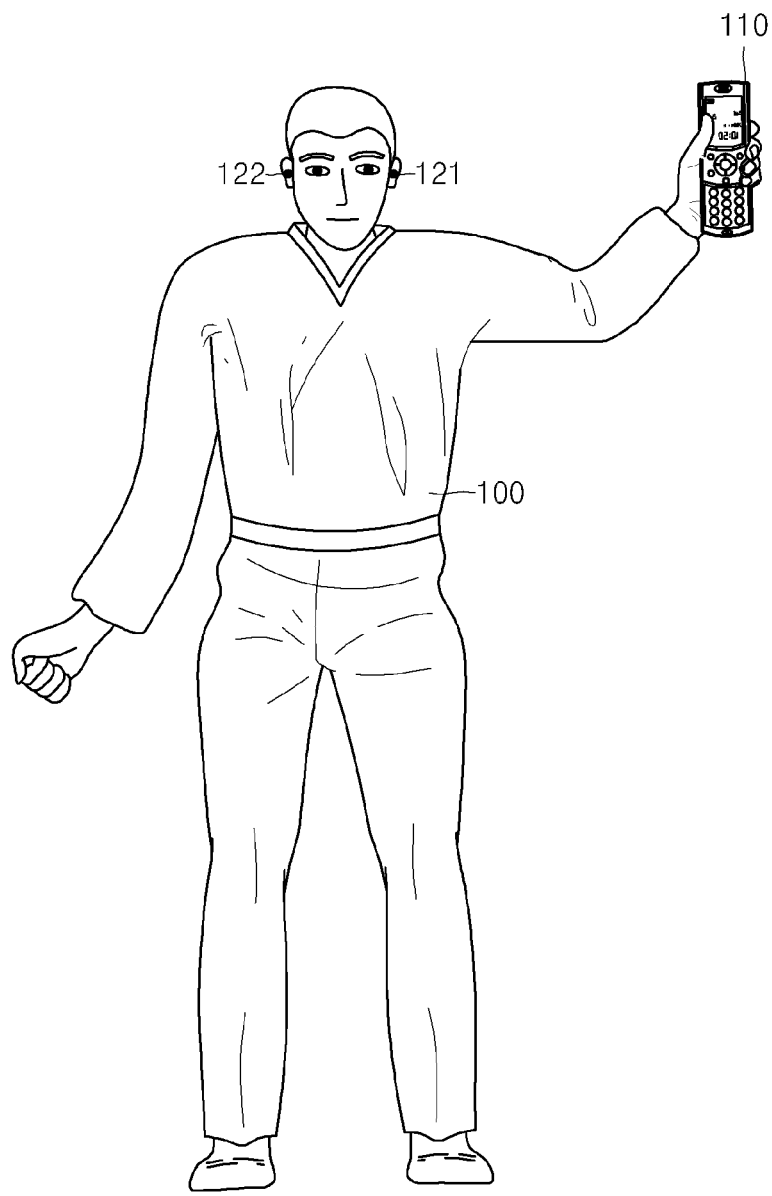
FIG. 1 is a perspective view of an example embodiment of a portable terminal and a sound detector.

The general inventive concept now will be described more fully hereinafter with reference to the accompanying drawings, in which various example embodiments are shown. The invention may, however, be embodied in many different forms, and should not be construed as limited to the embodiments set forth herein. Rather, these embodiments are provided so that this disclosure will be thorough and complete. The same reference characters refer to the same or like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated regions, integers, steps, operations, elements, and/or components, but do not preclude the presence or addition of one or more other regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein Example embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear aspects. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a portable terminal and one or more sound detectors, which all communicate using a body area network ("BAN"), according to various example embodiments of the general inventive concept will be described in further detail with reference to the accompanying drawings.

FIG. 1 is a perspective view of a portable terminal 110, a first sound detector 121 and a second sound detector 122 according to one or more example embodiments. In at least one embodiment, the first sound detector 121 is a left sound detector 121 and the second sound detector 122 is a right sound detector 122, but additional embodiments are not limited thereto.

A user 100 holds the portable terminal 110, which may be, for example, a moving picture expert group ("MPEG") audio layer 3 ("MP3") player, a portable multimedia player ("PMP"), a personal digital assistant ("PDA") or a mobile phone, for example, but is not limited thereto.

The first sound detector 121 and/or the second sound detector 122 may be disposed, e.g., positioned, proximate to the user 100, such as in the user's ear and/or ears. More specifically, for example, the left sound detector 121 and the right sound detector 122 may be respectively worn in the left and right ears of the user 100. In addition, the first sound detector 121 and the second sound detector 122 may be worn by being hung on the ears and/or by being inserted into each ear. In at least one example embodiment, the first sound detector 121 and the second sound detector 122 are a hearing aid or, alternatively, a headset. For purposes of description herein, it will be assumed that the first sound detector 121 and the second sound detector 122 are hearing aids, but it will be realized that additional example embodiments are not limited thereto.

As noted above, the left sound detector 121 may be positioned in the left ear and the right sound detector 122 may be positioned in the right ear of the user 100. In example embodiments, neither the first sound detector 121 nor the second sound detector 122 has, or requires, a wire connecting the sound detectors to each other. In addition, neither the sound detector 121, positioned in the left ear, nor the sound detector 122, positioned in the right ear, has, or requires, a wire connected to the portable terminal 110.

Instead, in one or more example embodiments, the left sound detector 121 communicates with the right sound detector 122 using a BAN, e.g., using the body of the user 100, instead of using (or requiring) a wire. Likewise, the left sound detector 121 and the right sound detector 122 communicate with the portable terminal 110 via the body of the user 100, e.g., via the BAN, instead of requiring a wire.

In the example embodiments described herein, the BAN is a communication method that transmits and receives data using the human body as a conductor. The BAN may be, for example, a direct data transmission/reception method (e.g., resistively coupled by contact with the body), or, alternatively, an indirect data transmission/reception method (e.g., capacitively coupled, not requiring contact with the body). In one or more embodiments, both the contact type and the non-contact type BANs are used for binaural communication between the sound detectors 121 and 122 (e.g., binaural hearing aids) and/or for the communications between the binaural hearing aids and the portable terminal 110. As a result, the embodiments described herein provide benefits that include, but are not limited to, substantially reduced power consumption, greatly simplified implementation (e.g., no wires are required), with the resultant benefit of easier and more efficient communications for a person who has difficulty hearing, for example.

Figure 2:
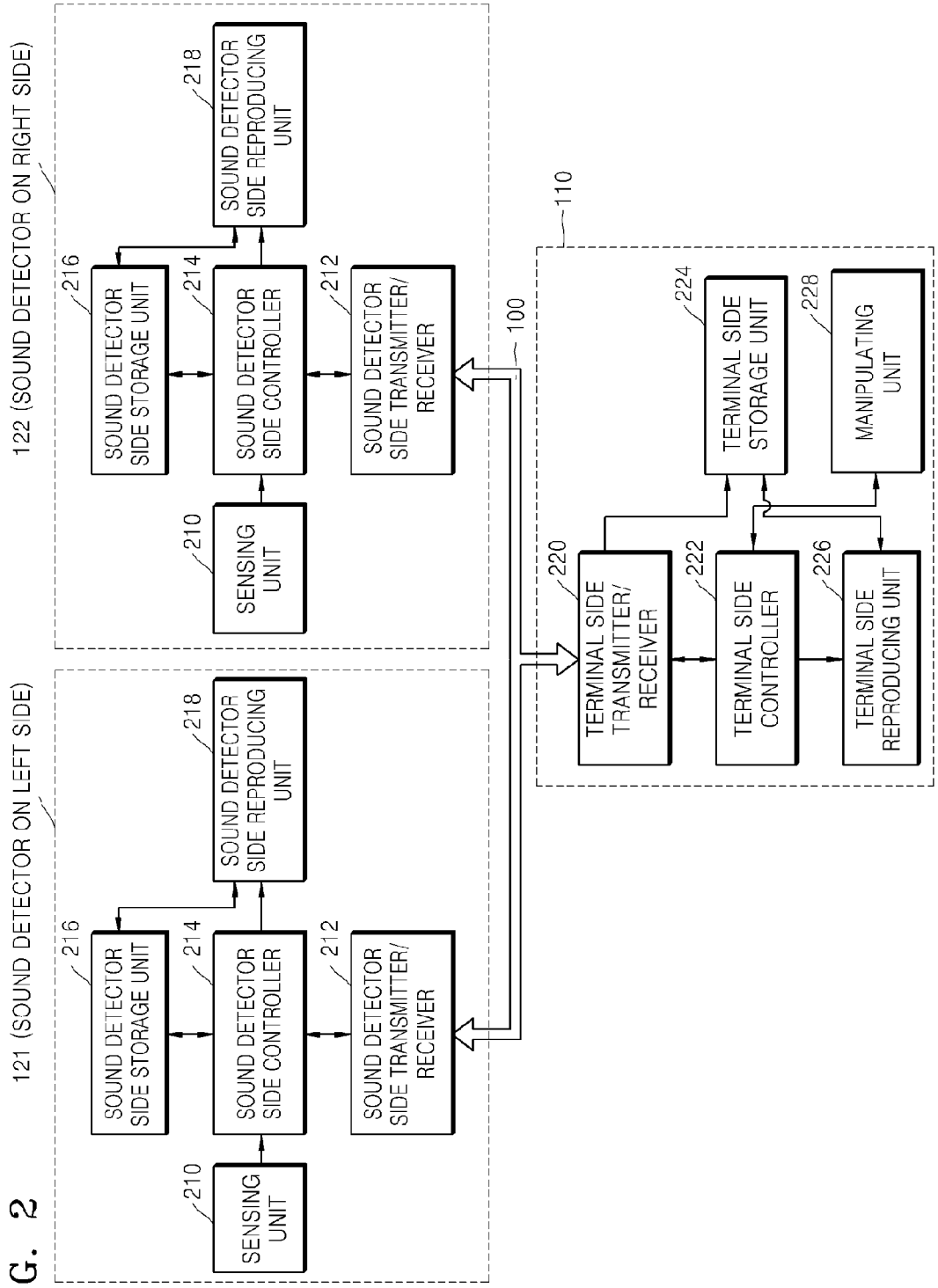
FIG. 2 is a block diagram of the portable terminal and the sound detector of FIG. 1.

FIG. 2 is a block diagram of the portable terminal 110, the first sound detector 121 and the second sound detector 122 of FIG. 1.

Referring to FIG. 2, the portable terminal 110 includes a terminal side transmitter/receiver 220, a terminal side controller 222, a terminal side storage unit 224, a terminal side reproducing unit 226 and a manipulating unit 228. In one or more example embodiments, the terminal side controller 222 may be a central processing unit ("CPU") chip and the terminal side storage unit 224 may be a memory. In addition, the terminal side transmitter/receiver 220 and the terminal side controller 222 may be an integrated card, or, alternatively, a module, but additional embodiments are not limited thereto. When the terminal side transmitter/receiver 220 and the terminal side controller 222 are an integrated card or module, the integrated card or module may be easily separated from and/or combined with the portable terminal 110.

Referring to FIG. 2, the first sound detector 121 and the second sound detector 122 each includes a sensing unit 210, a sound detector side transmitter/receiver 212, a sound detector side controller 214, a sound detector side storage unit 216 and a sound detector side reproducing unit 218. As shown, a separate sensing unit 210 may be included in both the first sound detector 121 and the second sound detector 122, particularly in example embodiments in which the first sound detector 121 and the second sound detector 122 are hearing aids. However, it will be noted that, in additional embodiments, such as when the first sound detector 121 and the second sound detector 122 are headsets, the sensing unit 210 may not be included in both the first sound detector 121 and the second sound detector 122. The sound detector side controller 214 may be a CPU chip and the sound detector side storage unit 216 may be a memory, which stores one or more of a control data from the portable terminal 110, a control data from the first sound detector 121 and/or the second sound detector 122 (either singly or in combination with each other), hearable data from the portable terminal 110, hearable data from the first sound detector 121 and/or the second sound detector 122 (either singly or in combination with each other), and hearable data that is sensed by the sensing unit (210), but additional example embodiments are not limited thereto.

The sound detector side controller 214 converts the hearable data so as to be reproduced in the sound detector side reproducing unit 218. For example, the sound detector side controller 214 may convert the hearable data by referring to control data stored in the sound detector side storage unit 216 or terminal side storage unit 224.

Also, the sound detector side controller 214 may amplify the hearable data sensed in the sensing unit 210 (this may be referred to as the first hearable data) and digitalize the amplified first hearable data. The digitalized first hearable data may be reproduced in the sound detector side reproducing unit 218 through a digital signal processing. For this purpose, the sound detector side controller 214 may further include an amplifier performing amplification, an analog/digital converter performing digitalization, and a digital signal processor (DSP) performing a digital signal processing.

In addition, the sound detector side controller 214 may perform an appropriate conversion process for the hearable data transmitted from the portable terminal 110 (this may be referred to as the second hearable data) according to the form of the second hearable data.

In an additional example embodiment, the terminal side transmitter/receiver 220 and the terminal side controller 222 are integrated, e.g., are combined into one unit. In addition, the one unit, including both the terminal side transmitter/receiver 220 and the terminal side controller 222, may be disposed separate from the portable terminal 110, such as outside the portable terminal 110 or, alternatively, in one of the sound detectors 121 or 122.

Hereinafter, additional example embodiments will be described in further detail with reference to FIGS. 2 through 9.

Figure 3:
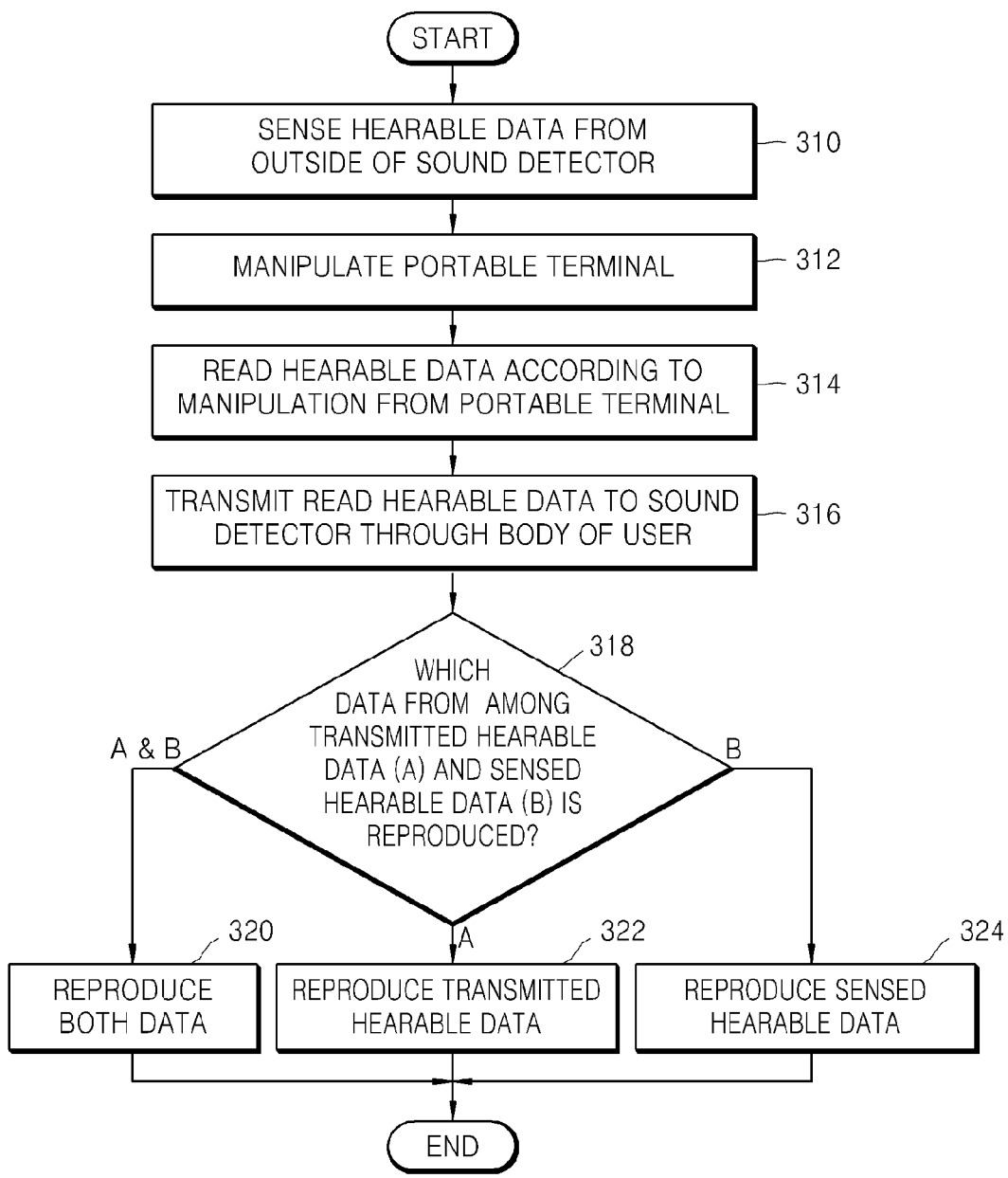

Referring now to FIGS. 2 and 3, in one or more example embodiments, hearable data is transmitted to the first sound detector 121 and/or the second sound detector 122 from the portable terminal 110 using only a BAN, e.g., through the body of the user 100. Additionally, the first sound detector 121 and/or the second sound detector 122 may sense hearable data (from outside the first sound detector 121 and/or the second sound detector 122) and reproduce the hearable data and/or transmit the hearable data to the portable terminal 110. In addition, the first sound detector 121 and/or the second sound detector 122 may reproduce at least a portion of either transmitted hearable data (from the portable terminal 110) or hearable data sensed by the first sound detector 121 and/or the second sound detector 122 (from outside), as will be described in greater detail below.

As used herein, "hearable data" denotes data that can be heard and examples of hearable data include audio/sound data such as speech and music. Moreover, for convenience of description, hearable data that is sensed from outside the first sound detector 121 and/or the second sound detector 122 will hereinafter be referred to as "first hearable data," while hearable data received in the first sound detector 121 and/or the second sound detector 122 from the portable terminal 110 will be referred to as "second hearable data." Accordingly, the first hearable data is sensed in operation 310 of FIG. 3 and the second hearable data is received in operation 314 of FIG. 3. For example, the "second hearable data" may be, but is not limited to, audio/sound data stored in the terminal side storage unit 224 in the portable terminal 110 or audio/sound data received through the portable terminal 110 (for example, if the portable terminal 110 is a mobile phone, the second hearable data may be telephone audio/sound data received from another mobile phone).

As noted above, the sensing unit 210 senses the first hearable data from outside the first sound detector 121 and/or the second sound detector 122. In the present embodiments, if the second hearable data is MP3 audio/sound data, the terminal side storage unit 224 in the portable terminal 110 stores the second hearable data.

As shown in FIG. 2, a manipulating unit 228 may be included in the portable terminal 110, and may include one or more keys and/or buttons or other components that the user 100 manipulates to control the portable terminal 110 and/or the sound detectors 121 and 122.

Specifically, for example, when the user 100 desires to access, e.g., to listen to, the second hearable data stored in the terminal side storage unit 224 using the first sound detector 121 and/or the second sound detector 122, the user 100 manipulates the manipulating unit 228 and the terminal side controller 222 recognizes the manipulation, reads the second hearable data corresponding to the manipulation from the terminal side storage unit 224, and transmits the read second hearable data to the terminal side transmitter/receiver 220. The terminal side transmitter/receiver 220 transmits the read second hearable data to the sound detector side transmitter/receiver 212 of the first sound detector 121 and/or the second sound detector 122 through the body of the user 100. More specifically, a small electric signal, e.g., an electric signal that is harmless to the body of the user 100, flows through the body of the user 100 to transmit the read second hearable data. The sound detector side transmitter/receiver 212 of the first sound detector 121 and/or the second sound detector 122 receives the read second hearable data from the terminal side transmitter/receiver 220 through the body of the user 100.

Still referring to FIGS. 2 and 3, when the first hearable data is sensed by the sensing unit 210 of the first sound detector 121 and/or the second sound detector 122, and the second hearable data is simultaneously received from the terminal side transmitter/receiver 220, the sound detector side controller 214 determines which hearable data, e.g., either one or both of the first hearable data and the second hearable data, is transmitted to the sound detector side reproducing unit 218. More particularly, the user 100 can select which, e.g., neither, either or both, of the hearable data that the user 100 desires to hear. Thus, according to the manipulation of the portable terminal 110, the sound detector side controller 214 determines whether the user 100 hears only the first hearable data sensed by the sensing unit 210, only the second hearable data received from the terminal side transmitter/receiver 220, or both the first hearable data sensed by the sensing unit 210 and the second hearable data received from the terminal side transmitter/receiver 220.

In an example embodiment, the determination of which hearable data is reproduced is performed automatically. In this case, criteria, which may be predetermined or determined by the user 100 using the manipulating unit 228, for example, are used for the determination. Moreover, if the user 100 does not make any such determination, the determination is performed based on respective priorities of the hearable data according to predetermined rules by the user 100. Specifically, for example, if the hearable data sensed from the sensing unit 210 has a higher priority than other hearable data, the hearable data that is sensed from the sensing unit 210 is transmitted to the sound detector side reproducing unit 218 by the sound detector side controller 214. If both of the hearable data have the same priority (or no priority), then both of the hearable data may be reproduced simultaneously. In this case, the predetermined rules may be stored in the sound detector side storage unit 216, or in the terminal side storage unit 224. If the predetermined rules are stored in the terminal side storage unit 224, the sound detector side transmitter/receiver 212 receives the predetermined rules from the portable terminal 110, and the sound detector side controller 214 determines which hearable data is reproduced according to the received predetermined rules.

Based on the manipulation and the resultant determination of which hearable data is transmitted to the sound detector side reproducing unit 218, the sound detector side reproducing unit 218 reproduces the first hearable data and/or the second hearable data transmitted by the sound detector side controller 214. In one or more example embodiments, the sound detector side reproducing unit 218 includes a speaker (not shown), but additional embodiments are not limited thereto. For example, in additional example embodiments, the sound detector side reproducing unit 218 may reproduce the hearable data in any way that allows the user 100 to recognize the hearable data. For example, the sound detector side reproducing unit 218 may reproduce the hearable data as an air conducting signal, which is transmitted to the user 100 through the air, or a bone conducting signal, which is transmitted to the user 100 through bone (for example, the user's skull), but alternative embodiments are not limited to the foregoing methods of reproducing the hearable data.

As described above, the sound detector side controller 214 determines which hearable data from among the first hearable data and the second hearable data is transmitted to the sound detector side reproducing unit 218. However, the present embodiments are not limited thereto and the terminal side controller 222 may determine which hearable data from among the first hearable data and the second hearable data is transmitted to the sound detector side reproducing unit 218, as will be described more fully later.

Another example embodiment will now be described in greater detail with reference to FIGS. 2 and 4.

In one or more example embodiments, control data, which is stored in the portable terminal 110, is transmitted to the first sound detector 121 and/or the second sound detector 122 through the body of the user 100 (e.g., using a BAN), and operational or other parameters of the first sound detector 121 and/or the second sound detector 122 are set according to the transmitted control data, as will be described in greater detail below.

The terminal side storage unit 224 stores the control data. As used herein, "control data" denotes information including at least one of sound detector information, user information and hearable data edit information.

Specifically, sound detector information denotes various setting information and/or state information corresponding to the first sound detector 121 and/or the second sound detector 122. More specifically, for example, the sound detector information may include volume information of the first sound detector 121 and/or the second sound detector 122, information regarding an operation mode of the first sound detector 121 and/or the second sound detector 122, fitting information of the first sound detector 121 and/or the second sound detector 122 (e.g., information relating to how the first sound detector 121 and/or the second sound detector 122 reproduces hearable data, and information adaptively set to the hearing ability of the user 100 in consideration of a hearing test performed for the user 100), information relating to remaining battery charge of the first sound detector 121 and/or the second sound detector 122, and information corresponding to an up-to-date record of previous and/or current operations of the first sound detector 121 and/or the second sound detector 122.

The user information denotes personal information pertaining to the user 100 wearing the first sound detector 121 and/or the second sound detector 122. The personal information for the user 100 wearing the first sound detector 121 and/or the second sound detector 122 may include, for example, the results of the hearing test, but alternative example embodiments are not limited thereto.

The hearable data edit information may include equalization setting information, including compensation gain corresponding to an audiogram of the user 100, for example, and also may include information existing in control data, which corresponds to any type of hearable data. Specifically, for example, when the first sound detector 121 or the second sound detector 122 converts hearable data using a previously-determined method and then reproduces the converted hearable data, the hearable data edit information may include, the previously-determined method.

In one or more embodiments, the control data is data to control the first sound detector 121 and/or the second sound detector 122. As described above, the control data may include data for controlling volume, for controlling gain regarding frequency, updating fitting information regarding degree of hearing loss of the user 100 (e.g., hearing impairments), and for controlling sound beam forming of the sensing unit 210, but are not limited thereto.

When the user 100 desires to transmit the control data stored in the terminal side storage unit 224 to the first sound detector 121 and/or the second sound detector 122, the user 100 manipulates the manipulating unit 228, and the terminal side controller 222 recognizes the manipulation, reads the control data from the terminal side storage unit 224 according to the recognition, and transmits the read control data to the terminal side transmitter/receiver 220. The terminal side transmitter/receiver 220 transmits the control data to the sound detector side transmitter/receiver 212 through the body of the user 100. Thus, the sound detector side transmitter/receiver 212 receives the control data from the terminal side transmitter/receiver 220 through the body of the user 100.

As a result, an operation of the first sound detector 121 and/or the second sound detector 122 is set according to the control data received from the portable terminal 110. In addition, existing setting information associated with the first sound detector 121 and/or the second sound detector 122 may be updated according to the received control data.

Accordingly, in an example embodiment, when the user 100 of the first sound detector 121 and/or the second sound detector 122 changes, e.g., a new/different user takes the first sound detector 121 and/or the second sound detector 122, and the new user has their own portable terminal, which stores the new user's own customized control data, the control data stored in the portable terminal is used to update the setting information of the first sound detector 121 and/or the second sound detector 122 to be optimized for the new user.

Another example embodiment will now be described in greater detail with reference to FIGS. 2 and 5.

In one or more embodiments, the second hearable data and control data are transmitted to the first sound detector 121 and/or the second sound detector 122 from the portable terminal 110 through the body of the user 100, and the first sound detector 121 and/or the second sound detector 122 reproduces at least a portion of the transmitted second hearable data and the hearable data sensed by the first sound detector 121 and/or the second sound detector 122, as will be described in further detail below.

The sensing unit 210 senses the first hearable data from outside the first sound detector 121 and/or the second sound detector 122. At least one of the sound detector side storage unit 216 and the terminal side storage unit 224 stores the control data that corresponds to the first hearable data. If the terminal side storage unit 224 stores the control data that corresponds to the first hearable data, the control data may be transmitted to the sound detector side transmitter/receiver 212 through the body of the user 100. Here, the control data stored in the sound detector side storage unit 216 may be updated according to the control data received from the portable terminal 110. Accordingly, the sound detector side controller 214 may convert the first hearable data by using the control data that corresponds to the first hearable data stored in any one of the sound detector side storage unit 216 and the terminal side storage unit 224.

The terminal side storage unit 224 may store the second hearable data and the control data that corresponds to the second hearable data. The control data that corresponds to the second hearable data may also be stored in the sound detector side storage unit 216 of the first sound detector 121 and/or the second sound detector 122.

In the present embodiment, it is assumed that the second hearable data is MP3 audio/sound data. When the user 100 desires to hear any hearable data from among the second hearable data stored in the terminal side storage unit 224 through the first sound detector 121 and/or the second sound detector 122, the user 100 manipulates the manipulating unit 228, and the terminal side controller 222 recognizes the manipulation, reads the second hearable data and control data corresponding to the recognition from the terminal side storage unit 224, and transmits the read second hearable data and the read control data to the terminal side transmitter/receiver 220. The terminal side transmitter/receiver 220 transmits the second hearable data and the control data to the sound detector side transmitter/receiver 212 through the body of the user 100, e.g., via the BAN. The sound detector side transmitter/receiver 212 receives the second hearable data and the control data from the terminal side transmitter/receiver 220 through the body of the user 100.

When the first hearable data sensed by the sensing unit 210 and the second hearable data are simultaneously received, the sound detector side controller 214 determines which of the first and second hearable data is transmitted to the sound detector side reproducing unit 218, e.g., whether the user 100 will hear only the first hearable data sensed by the sensing unit 210, only the second hearable data received from the terminal side transmitter/receiver 220, or both the first hearable data sensed by the sensing unit 210 and the second hearable data received from terminal side transmitter/receiver 220, according to the portable terminal 110 being manipulated. Thus, in one or more example embodiments, the sensing unit 210 may sense and record hearable data, while simultaneously transmitting hearable data to the sound detector side reproducing unit 218.

When it is determined that the second hearable data received from the terminal transmitter/receiver 220 is transmitted to the sound detector side reproducing unit 218, the sound detector side controller 214 stores the control data corresponding to the second hearable data received from terminal side transmitter/receiver 220 in the sound detector side storage unit 216.

The sound detector side reproducing unit 218 reproduces the appropriate hearable data transmitted by the sound detector side controller 214. If the hearable data received by the sound detector side controller 214 is the second hearable data transmitted from the terminal side transmitter/receiver 220 and the control data (e.g., only hearable data edit information) corresponding to the second hearable data, the second hearable data is stored in the sound detector side storage unit 216 along with the control data, and the sound detector side controller 214 converts the second hearable data according to the control data corresponding to the second hearable data and the sound detector side reproducing unit 218 reproduces the converted second hearable data. The sound detector side reproducing unit 218 according to one or more embodiments may include a speaker (not shown).

If the sound detector side controller 214 determines to transmit the first hearable data sensed by the sensing unit 210 to the sound detector side reproducing unit 218, the sound detector side controller 214 converts the first hearable data according to the control data corresponding to the first hearable data stored in at least any one of the sound detector side storage unit 216 and the terminal side storage unit 224, and the sound detector side reproducing unit 218 reproduces the converted first hearable data.

The sound detector side controller 214 determines which hearable data between the first hearable data and the second hearable data is transmitted to the sound detector side reproducing unit 218. However, the present embodiment is not limited thereto and the terminal side controller 222 may determine which hearable data between the first hearable data and the second hearable data is transmitted to the sound detector side reproducing unit 218, as will be described more fully later.

Another example embodiment will now be described in greater detail with reference to FIGS. 2 and 6.

In an example embodiment, the sound detector 121 or 122 transmits first hearable data to the portable terminal 110 through the body of the user 100, and the portable terminal 110 reproduces the transmitted first hearable data, as will be described in further detail below.

When the user 100 manipulates the portable terminal 110 to receive the first hearable data from the sound detector 121 or 122, the terminal side controller 222 recognizes the manipulation and allows the terminal side transmitter/receiver 220 to receive the first hearable data from the sound detector side transmitter/receiver 212 according to the recognition. In one or more embodiments, the hearable data received by the terminal side transmitter/receiver 220 may be first hearable data that was previously stored in the sound detector side storage unit 216.

When the terminal side transmitter/receiver 220 receives the first hearable data from the sound detector side transmitter/receiver 212, the terminal side storage unit 224 stores the first received hearable data.

The terminal side controller 222 converts the received first hearable data into hearable data having a format that is recognizable by the portable terminal 110, e.g., into second hearable data. The terminal side storage unit 224 may store the first hearable data before it is converted, or, alternatively, may store the second hearable data that has been converted by the terminal side controller 222.

For example, the first hearable data sensed in the sensing unit 210 of the first sound detector 121 and/or the second sound detector 122 may be stored in the terminal side storage unit 224 of the portable terminal 110. Here, the first hearable data may be stored in the terminal side storage unit 224 by being converted into a format (for example, a MP3 file format) so as to be reproduced in the terminal side reproducing unit 226.

The terminal side reproducing unit 226 reproduces the second hearable data converted by the terminal side controller 222. The terminal side reproducing unit 226 may include a speaker (not shown).

Another example embodiment will now be described in greater detail with reference to FIGS. 2 and 7.

In an example embodiment, the sound detector 121 or 122 transmits control data to the portable terminal 110 through the body of the user 100, as will be described in further detail below.

When the user 100 manipulates the portable terminal 110 to receive the control data from the sound detector 121 or 122, the terminal side controller 222 recognizes the manipulation and allows the terminal side transmitter/receiver 220 to receive the control data from the sound detector side transmitter/receiver 212 according to the recognition. In one or more embodiments, the control data includes sound detector information and/or user information, but additional example embodiments are not limited thereto.

When the terminal side transmitter/receiver 220 receives the control data from the sound detector side transmitter/receiver 212, the terminal side storage unit 224 stores the received control data. Accordingly, the control data previously stored in the terminal side storage unit 224 may be updated.

Thus, according to at least one example embodiment, when the user 100 desires to replace one or more of the sound detectors 121 and 122, the control data stored in the sound detector 121 or 122 may be temporarily stored in the portable terminal 110 before replacing the sound detectors 121 and/or 122. Then, after replacing the sound detectors 121 and/or 122, the user 100 manipulates the portable terminal 110 to provide the control data, previously stored in the portable terminal 110, to the replacement sound detector(s). For example, the user 100 may manipulate the terminal as described above with reference to the example embodiment shown in FIG. 4. Accordingly, the user 100 may conveniently begin using the replacement sound detector(s) as usual after the replacement, e.g., without having to manually reenter the control data that was stored in the sound detector 121 or 122 that was removed during the replacement.

Another example embodiment will now be described in greater detail with reference to FIGS. 2 and 8.

In an example embodiment, the sound detector 121 or 122 transmits hearable data and control data to the portable terminal 110 through the body of the user 100, and the portable terminal 110 reproduces the transmitted hearable data, as will be described in greater detail below.

Specifically, when the user 100 manipulates the portable terminal 110 to receive hearable data and control data from the sound detector 121 or 122, the terminal side controller 222 recognizes the manipulation and allows the terminal side transmitter/receiver 220 to receive the hearable data and the control data from the sound detector side transmitter/receiver 212 according to the recognition. The received hearable data may be the first hearable data, sensed in the sensing unit 210, or, alternatively, may be hearable data previously stored in the sound detector side storage unit 216. In an embodiment, the control data includes at least one of sound detector information, user information and hearable data edit information, as were described in greater detail above.

When the terminal side transmitter/receiver 220 receives both the hearable data and the control data from the sound detector side transmitter/receiver 212, the terminal side storage unit 224 stores both the received hearable data and the control data therein.

The terminal side controller 222 converts the hearable data and the control data received in the terminal side transmitter/receiver 220 into hearable data and control data having a format that is recognizable by the portable terminal 110. The terminal side storage unit 224 may store hearable data and control data that are not converted, or, alternatively, may store hearable data and control data that have been converted by the terminal side controller 222. As described above, the format that is recognizable by the portable terminal 110 may be a MP3 file format.

The terminal side reproducing unit 226 reproduces the hearable data converted by the terminal side controller 222. In one or more embodiments, the control data corresponds to the hearable data to be reproduced, as described above, and the terminal side controller 222 converts the hearable data according to the control data and thereafter the terminal side reproducing unit 226 reproduces the converted hearable data. The terminal side reproducing unit 226 may include a speaker (not shown).

Another example embodiment will now be described in greater detail with reference to FIGS. 2 and 9.

In an example embodiment, a sound detector system includes a first sound detector 121 and a second sound detector 122, and control data (e.g., sound detector information) from one of the first sound detector 121 and the second sound detector 122, which are worn on the user's ears, is updated according to control data from the other sound detector of the first sound detector 121 and the second sound detector 122, as will now be described in further detail.

When the sensing unit 210 of one sound detector (for example, the first sound detector 121 on the left side) senses a volume level of outside hearable data, e.g., the first hearable data, the sound detector side controller 214 of the sound detector 121 updates control data (e.g., sound detector information) stored in the sound detector side storage unit 216 and setting information of the sound detector 121 is updated based on the control data. Specifically, for example, an operation mode of the sound detector 121 or 122 is adaptively determined according to a noise environment (determined, for example, by the volume level) outside the sound detector 121 or 122. Thus, when a relatively loud noise is suddenly sensed in the sound detector 121 on the left side, sound detector information included in the sound detector 121 on the left side is updated in response to the loud noise, and the operation mode of the sound detector 121 on the left side is updated accordingly. For example, the volume level of the sound heard by the user 100 through the sound detector 121 decreases. Accordingly, the noise level heard by the user 100 may be adaptively adjusted.

When the setting information of the sound detector 121 on the left side is updated, the sound detector side controller 214 in the sound detector 121 on the left side allows the sound detector side transmitter/receiver 212 to transmit the updated control data (e.g., the sound detector information) to the sound detector side transmitter/receiver 212 in the second sound detector 122 (on the right side) through the body of the user 100. Accordingly, the sound detector side controller 214 in the sound detector 122 on the right side updates control data (sound detector information) stored in the sound detector side storage unit 216 according to the control data (the sound detector information) received in the sound detector side transmitter/receiver 212 of the sound detector 122 on the right side. Thus, setting information of the sound detector 122 on the right side is updated adaptively to the setting information of the sound detector 121 on the left side. For example, when the loud noise is suddenly sensed in the sound detector 121 on the left side, the operation mode of the sound detector 121 on the left side is changed, and the sound detector 122 on the right side may be changed immediately based on the sound detector 121 on the left side to prevent adversely affecting the hearing ability of the user 100. According to one or more embodiments, when the control data (e.g., the sound detector information) stored in the sound detector side storage unit 216 of the sound detector 121 on the left side is updated, the operation mode of the sound detector 121 on the left side is changed, and the sound detector side transmitter/receiver 212 of the sound detector 121 on the left side transmits the updated control data to the sound detector side transmitter/receiver 212 of the sound detector 122 on the right side, so that the sound detector 122 on the right side updates the control data (the sound detector information) stored in the sound detector side storage unit 216 of the sound detector 122 on the right side to change the operation mode of the sound detector 122 on the right side, as well. Thus, since the sound detector 121 on the left side transmits control data to the sound detector 122 on the right side through the body of the user 100 without using or requiring any wire or wires, the data is transmitted efficiently and accurately (e.g., with a bit error rate less than about $10^{-3}$).

Thus, according to the example embodiments described herein with reference to FIGS. 2 through 9, data communication is performed between the sound detectors 121 and/or 122 and the portable terminal 110, as well as between the sound detector 121 (on the left side) and the sound detector 122 (on the right side). The abovementioned data communications are performed through the body of the user 100, e.g., the BAN, without requiring any wires or RF communications.

As such, according to the example embodiments described herein, communication is efficiently performed, using substantially reduced amounts of electric power, between the first sound detector 121 and the second detector 122 and between the portable terminal 110 and the sound detector 121 and/or the sound detector 122. Moreover, one or more example embodiments include an error correction method or device, such as an error correcting encoder (not shown), for example. In addition, example embodiments require substantially less electric power than transmitting wirelessly using a conventional method, such as radio frequency ("RF") communications, for example. Specifically, in an example embodiment, the power consumption is from only about 1 milliwatt (mW) to about 2 mW, whereas the power consumption of a conventional RF communication method is from at least about 10 mW to about 30 mW or more.

A method of determining a reproduction mode of the first sound detectors 121 and/or second sound detector 122 in the terminal side controller 222 according to another embodiment of the present invention is described below.

In addition, in a sound reproducing system including the first sound detector 121 and/or the second sound detector 122 and the portable terminal 110, the first sound detector 121 and/or the second sound detector 122 may adaptively control a reproduction mode by referring to the control data received from the portable terminal 110 and thus hearable data may be reproduced. Here, the reproduction mode according to one or more example embodiments denotes how the hearable data is reproduced in the first sound detector 121 and/or the second sound detector 122 and may be determined by the control data described above.

More specifically, the sensing unit 210 included in the first sound detector 121 and/or the second sound detector 122 senses the first hearable data from the outside of the first sound detector 121 and/or the second sound detector 122.

The terminal side controller 222 of the portable terminal 110 determines a reproduction mode in correspondence to the manipulation of the portable terminal 110 by the user 100. Here, the second hearable data may be previously stored in the terminal side storage unit 224 or may be received from the outside of the portable terminal 110. For example, the second hearable data may be MP3 audio/sound data that is previously stored in the portable terminal 110 or audio/sound data of a call received in the portable terminal 110. If the second hearable data is reproduced through the first sound detector 121 and/or the second sound detector 122, the second hearable data may be transmitted to the first sound detector 121 and/or the second sound detector 122 from the portable terminal 110 through the BAN.

The terminal side transmitter/receiver 220 of the portable terminal 110 transmits the control data according to the reproduction mode determined in the terminal side controller 222 to the first sound detector 121 and/or the second sound detector 122 only by using the BAN and the sound detector side reproducing unit 218 of the first sound detector 121 and/or the second sound detector 122 reproduces at least one hearable data between the first hearable data and the second hearable data by referring to the control data.

The reproduction mode determined in the terminal side controller 222 of the portable terminal 110 may be one selected from the group consisting of a mode for reproducing the first hearable data, a mode for reproducing the second hearable data, and a mode for simultaneously reproducing the first hearable data and the second hearable data.

The reproduction mode may be determined based on the manipulation of the portable terminal 110 by the user 100 or may be determined based on predetermined rules. When the first sound detector 121 and/or the second sound detector 122 is a hearing aid and the portable terminal 110 is a mobile phone, the user 100 may manipulate the manipulating unit 228 of the portable terminal 110 and determine the reproduction mode, if the user 100 wearing the first sound detector 121 and/or the second sound detector 122 receives a call in the portable terminal 110. For example, the user 100 may select at least one data to be reproduced from between the first hearable data sensed in the first sound detector 121 and/or the second sound detector 122 and the second hearable data from the portable terminal 110 by manipulating the manipulating unit 228 and the terminal side controller 222 of the portable terminal 110 may determine the reproduction mode according to the selection of the user 100. However, if the predetermined rules exist in the portable terminal 110, the reproduction mode may be automatically determined by the terminal side controller 222 of the portable terminal 110 without the selection of the user 100.

In addition, if the reproduction mode determined by the terminal side controller 222 of the portable terminal 110 is the mode for simultaneously reproducing the first hearable data and the second hearable data, the terminal side controller 222 of the portable terminal 110 may further determine setting information for reproducing each of the first hearable data and the second hearable data.

Accordingly, the sound detector side controller 214 of the first sound detectors 121 and/or second sound detector 122 converts the hearable data reproduced in the first sound detectors 121 and/or second sound detector 122 according to the control data by referring to the reproduction mode determined in the portable terminal 110. For example, the sound detector side controller 214 may adjust the volume level for reproducing the first hearable data by referring to the reproduction mode.

For example, if the reproduction mode is a simultaneous reproduction and the volume level of the first hearable data sensed in the sensing unit 210 of the first sound detectors 121 and/or second sound detector 122 is great, the sound detector side controller 214 converts the first hearable data so as to decrease the volume level of the first hearable data. Accordingly, the second hearable data may be prevented from being unrecognized by the user 100 due to reproduction of the first hearable data.

FIG. 3 is a flowchart illustrating an example embodiment of a method of controlling data using a BAN and is described with reference to FIG. 2 below. The second hearable data according to the present embodiment is described as data stored in the portable terminal 110. However, the present embodiment is not limited thereto.

Referring to FIGS. 2 and 3, in operation 310, the sound detector 121 or 122 senses hearable data from outside the sound detector 121 or 122 (e.g., the first hearable data).

In operation 312, the user 100 manipulates the portable terminal 110 and, in operation 314, the portable terminal 110 reads the second hearable data according to the portable terminal 110 manipulated in operation 312.

In operation 316, the portable terminal 110 transmits the second hearable data (read in operation 314) to the sound detector 121 or 122 through the body of the user 100.

In operation 318, the sound detector 121 or 122 determines which of the data from among the second hearable data (transmitted in operation 316) and the first hearable data (sensed in operation 310) is to be reproduced, according to the manipulation of the portable terminal 110. More specifically, for example, when the user 100 manipulates the portable terminal 110 to reproduce the first hearable data sensed in operation 310, the sound detector 121 or 122 determines that the hearable data sensed in operation 310 is to be reproduced.

Thus, when it is determined in operation 318 that both the second hearable data transmitted in operation 316 and the first hearable data sensed in operation 310 are to be reproduced, for example, the sound detector 121 or 122 reproduces both the second hearable data transmitted in operation 316 and the first hearable data sensed in operation 310 (operation 320).

On the other hand, when it is determined in operation 318 that only the second hearable data transmitted in operation 316 is to be reproduced, the sound detector 121 or 122 reproduces only the second hearable data (operation 322).

Conversely, when it is determined in operation 318 that only the first hearable data sensed in operation 310 is to be reproduced, the sound detector 121 or 122 reproduces only the first hearable data (operation 324).

Figure 4:
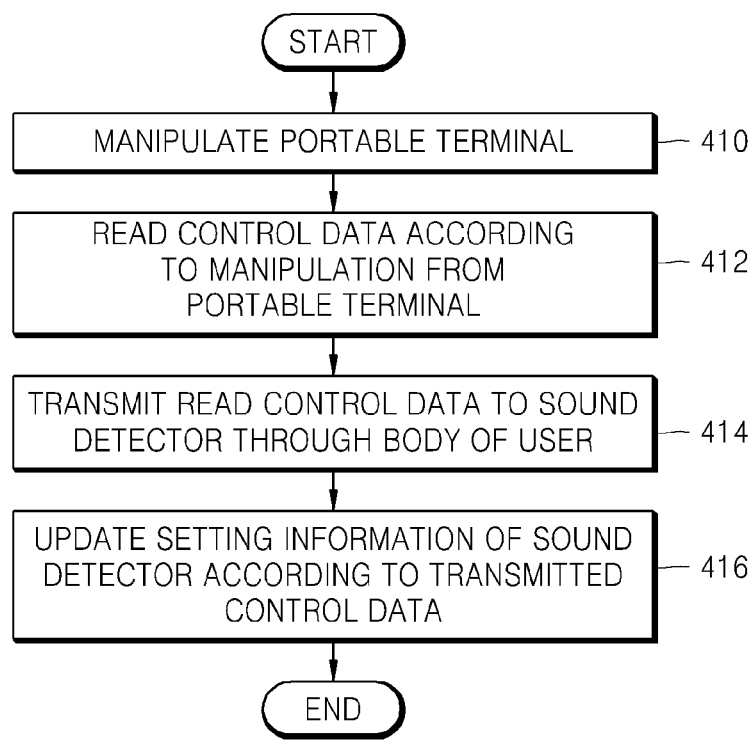

FIG. 4 is a flowchart illustrating another example embodiment of a method of controlling data using a BAN.

Referring to FIGS. 2 and 4, in operation 410, the user 100 manipulates the portable terminal 110 and, in operation 412, the portable terminal 110 reads control data according to the portable terminal 110 manipulated in operation 410.

The portable terminal 110 transmits the control data read in operation 412 to the sound detector 121 or 122 through the body of the user 100 (operation 414).

In operation 416, setting information of the sound detector 121 or 122 is updated, according to the control data transmitted in operation 414.

Figure 5:
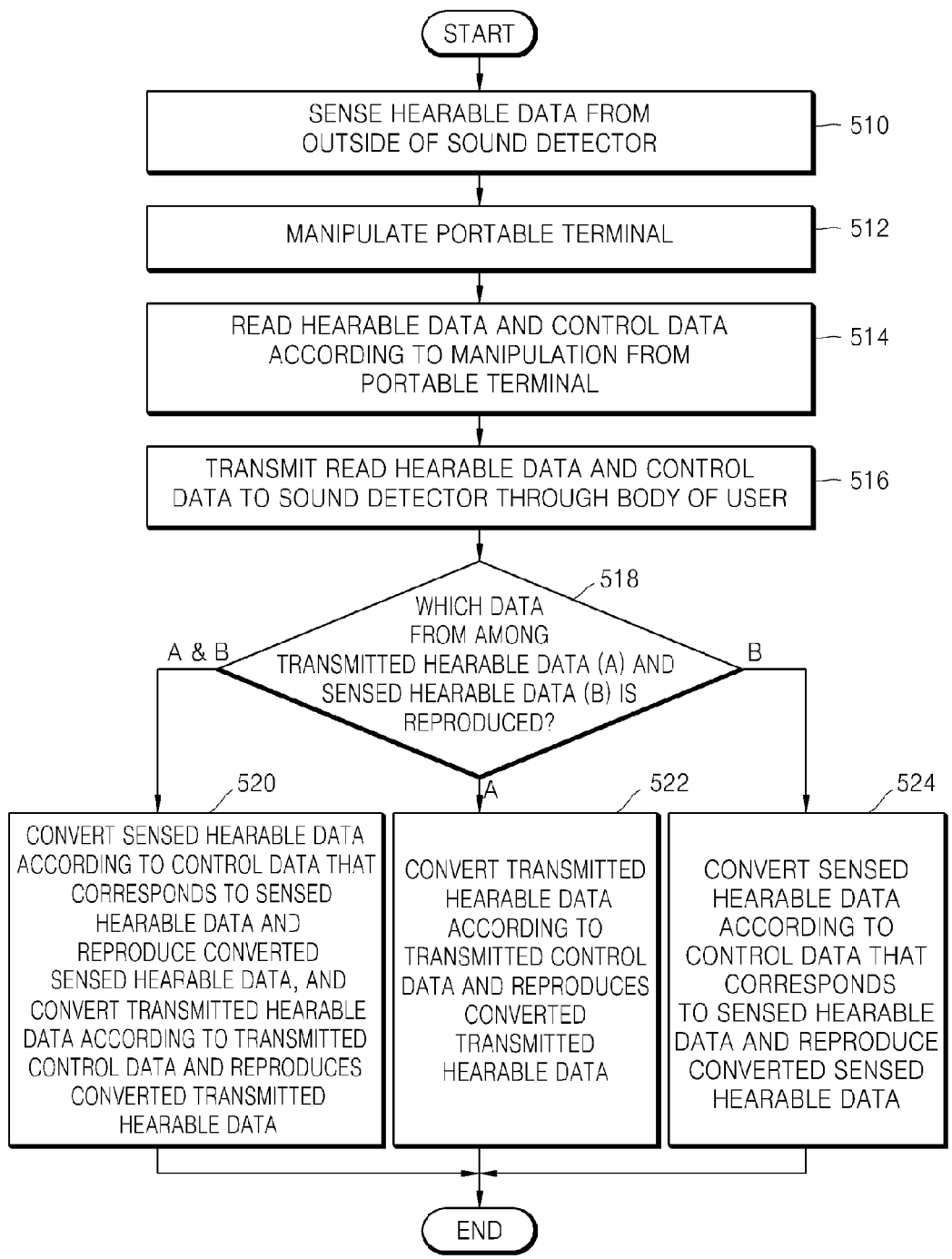

FIG. 5 is a flowchart illustrating still another example embodiment of a method of controlling data using a BAN. The second hearable data according to the present embodiment is described as data stored in the portable terminal 110. However, the present embodiment is not limited thereto.

Referring to FIGS. 2 and 5, in operation 510, the sound detector 121 or 122 senses first hearable data from outside the sound detector 121 or 122.

In operation 512, the user 100 manipulates the portable terminal 110. In operation 514, the portable terminal 110 reads second hearable data and control data according to the portable terminal 110 being manipulated in operation 512.

In operation 516, the portable terminal 110 transmits the second hearable data and the control data read in operation 514 to the sound detector 121 or 122 through the body of the user 100.

The sound detector 121 or 122 determines which of the data between the second hearable data transmitted in operation 516 and the first hearable data sensed in operation 510 is to be reproduced according to the portable terminal 110 being operated (operation 518).

In operation 520, when it is determined in operation 518 that both the second hearable data transmitted in operation 516 and the first hearable data sensed in operation 510 are to be reproduced, the sound detector 121 or 122 converts the second hearable data transmitted in operation 516 according to the control data transmitted in operation 516 and reproduces the converted second hearable data. Simultaneously, the sound detector 121 and/or 122 converts the first hearable data sensed in operation 510 according to the control data that corresponds to the first hearable data and reproduces the converted first hearable data. Here, the control data that corresponds to the first hearable data may be stored in any one of the sound detector side storage unit 216 and the terminal side storage unit 224.

When it is determined in operation 518 that only the second hearable data transmitted in operation 516 is to be reproduced, the sound detector 121 or 122 converts the second hearable data transmitted in operation 516 according to the control data transmitted in operation 516 and reproduces the converted second hearable data (operation 522).

In operation 524, when it is determined in operation 518 that only the first hearable data sensed in operation 510 is to be reproduced, the sound detector 121 and/or 122 converts the first hearable data according to the control data that corresponds to the first hearable data and reproduces the converted first hearable data. Here, the control data that corresponds to the first hearable data may be stored in any one of the sound detector side storage unit 216 and the terminal side storage unit 224.

FIG. 6 is a flowchart illustrating another example embodiment of a method of controlling data using a BAN.

Referring to FIGS. 2 and 6, in operation 610, the user 100 manipulates the portable terminal 110.

The sound detector 121 or 122 transmits first hearable data, according to the manipulation of the portable terminal 110 in operation 610, to the portable terminal 110 through the body of the user 100 (operation 612).

In operation 614, the portable terminal 110 converts the first hearable data transmitted in operation 612 into a format recognizable by the portable terminal 110.

In operation 616, the portable terminal 110 reproduces the hearable data (converted in operation 614).

FIG. 7 is a flowchart illustrating yet another example embodiment of a method of controlling data using a BAN.

Referring to FIGS. 2 and 7, the user 100 manipulates the portable terminal 110 (operation 710).

The sound detector 121 or 122 transmits control data according to the portable terminal 110 (manipulated in operation 710) to the portable terminal 110 through the body of the user 100 (operation 712).

In operation 714, the portable terminal 110 stores the control data transmitted in operation 712.

FIG. 8 is a flowchart illustrating an additional example embodiment of a method of controlling data using a BAN.

Referring to FIGS. 2 and 8, in operation 810, the user 100 manipulates the portable terminal 110.

The sound detector 121 or 122 transmits hearable data and control data according to the portable terminal 110 (manipulated in operation 810) to the portable terminal 110 through the body of the user 100 (operation 812).

The portable terminal 110 converts the hearable data and the control data transmitted in operation 812 into a format recognizable by the portable terminal 110 (operation 814).

The portable terminal 110 converts the hearable data, the format of which is converted in operation 814, according to the control data, the format of which is converted in operation 814 (operation 816).

In operation 818, the portable terminal 110 reproduces the hearable data, the format of which is converted in operation 816.

FIG. 9 is a flowchart illustrating still another example embodiment of a method of controlling data using a BAN.

Referring to FIGS. 2 and 9, in operation 910, control data (such as sound detector information, for example) of one sound detector (e.g., the sound detector 121 on the left side) is updated.

In operation 912, the sound detector 121 (on the left side) transmits the control data updated in operation 910 to the other sound detector (e.g., to the sound detector 122 on the right side) through the body of the user 100.

The sound detector 122 (on the right side) updates the control data (the sound detector information) previously stored therein according to the control data transmitted in operation 912 (operation 914).

Figure 10:
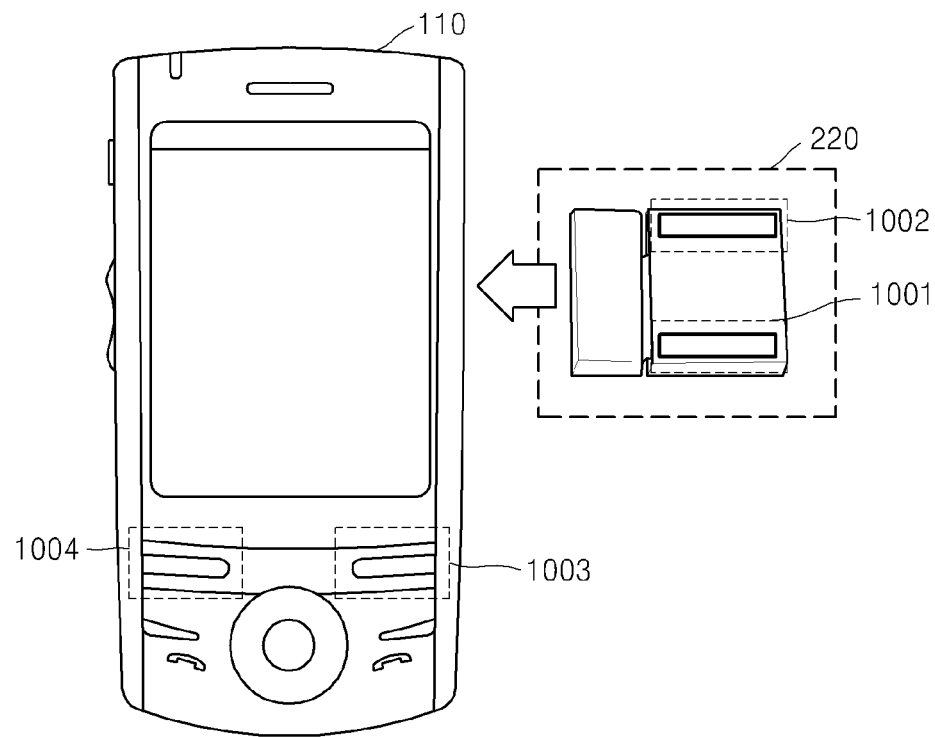
FIG. 10 is a block diagram of an example embodiment of a portable terminal.

Referring to FIG. 10, which is a block diagram of a portable terminal 110 according to an additional example embodiment, the terminal side transmitter/receiver 220 may be disposed separate from the portable terminal 110. In addition, the terminal side controller 222 and the terminal side transmitter/receiver 220 may be included in one combined unit, and the combined unit may be disposed separate from the portable terminal 110.

Further, the terminal side transmitter/receiver 220 may further include electrodes 1001 and 1002. When the terminal side transmitter/receiver 220 is attached to the portable terminal 110, the electrodes 1001 and 1002 are electrically connected to electrodes 1003 and 1004 disposed (e.g., mounted) on the portable terminal 110.

For example, if the portable terminal 110 does not support a function of body area network, the terminal side transmitter/receiver 220 including electrodes 1001 and 1002 is attached to the portable terminal 110, thus, the portable terminal 110, which does not support the function of body area network, may support the function of body area network by using the electrodes 1001 and 1002 included in the terminal side transmitter/receiver 220. If the portable terminal 110 supports the function of body area network, e.g., the portable terminal 110 includes electrodes 1003 and 1004 as described in FIG. 10, the portable terminal 110 may support the function of body area network by using the electrodes 1003 and 1004.

The portable terminal 110 communicates with the left side detector 121 (FIG. 1) and/or the right side detector 122 (FIG. 1) through the body of the user 100 (FIG. 1) by using the electrodes 1001 and 1002 or 1003 and 1004. Specifically, the left side detector 121 and/or the right side detector 122 communicate with the portable terminal 110 through the body of the user 100, when the user 100 touches, or is close to electrodes 1001 and 1002 or 1003 and 1004.

Figure 11:
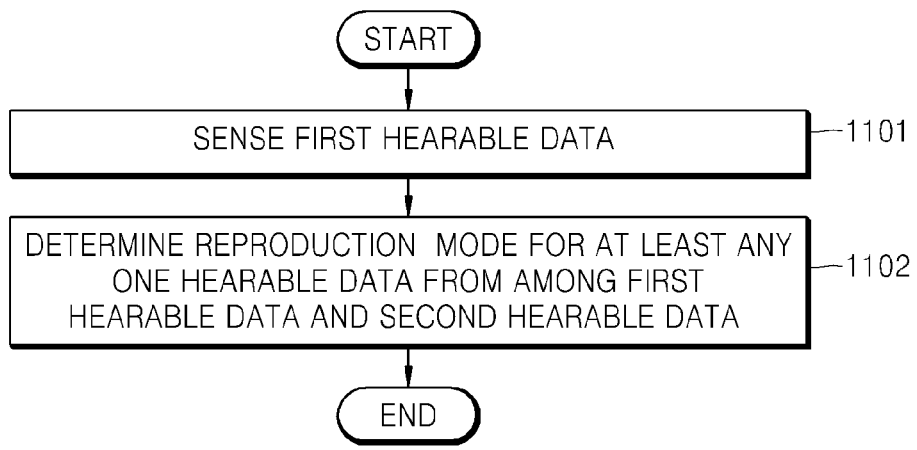
FIG. 11 is a flowchart illustrating a method of determining hearable data reproduced in a sound detector which communicates with a portable terminal.

FIG. 11 is a flowchart illustrating a method of determining hearable data reproduced in the first sound detector 121 and/or the second sound detector 122 which communicate with the portable terminal 110. The method of a method of determining hearable data reproduced in the first sound detector 121 and/or the second sound detector 122 which communicate with the portable terminal 110 includes operations processed in sequence in the first sound detector 121 and/or the second sound detector 122 and the portable terminal 110. Accordingly, if any details are omitted, the detailed description with respect to the first sound detector 121 and/or the second sound detector 122 and the portable terminal 110 in FIG. 2 may be applied to the method of determining hearable data reproduced in the first sound detector 121 and/or the second sound detector 122 which communicate with the portable terminal 110.

In operation 1101, the sensing unit 210 of the first sound detector 121 and/or the second sound detector 122 senses the first hearable data from the outside of the first sound detector 121 and/or the second sound detector 122.

In operation 1102, the terminal side controller 222 of the portable terminal 110 or the sound detector side control 214 of the first sound detector 121 and/or the second sound detector 122 determines a reproduction mode for reproducing at least one hearable data from the first hearable data and second hearable data in correspondence to the manipulation of the portable terminal 110 by the user 100.

Figure 12:
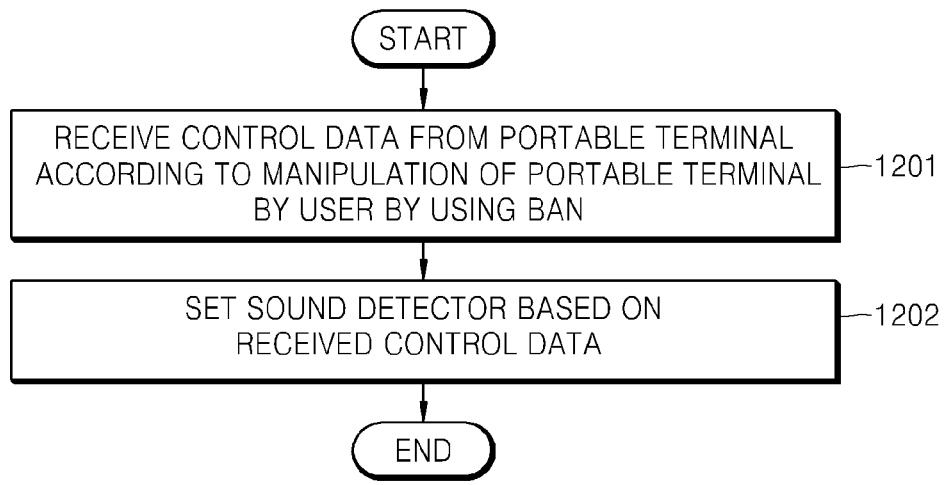
FIG. 12 is a flowchart illustrating a method of controlling sound detector.

FIG. 12 is a flowchart illustrating a method of controlling the first sound detector 121 and/or the second sound detector. The method of controlling the first sound detector 121 and/or the second sound detector includes operations processed in sequence in the first sound detector 121 and/or the second sound detector 122 and the portable terminal 110. Accordingly, if any details are omitted, the detailed description with respect to the first sound detector 121 and/or the second sound detector 122 and the portable terminal 110 in FIG. 2 may be applied to the method of controlling the first sound detector 121 and/or the second sound detector 122.

In operation 1201, the sound detector side transmitter/receiver 212 of the first sound detector 121 and/or the second sound detector 122 receives control data, which controls the sound detector, from the portable terminal 110 according to a manipulation of the portable terminal 110 by the user 100 by using a body area network (BAN).

In operation 1202, the sound detector side controller 214 of the first sound detector 121 and/or the second sound detector 122 sets the first sound detector 121 and/or the second sound detector 122 based on the received control data.

Thus, the user 100 may conveniently determine the reproduction mode of the first sound detector 122 and/or the second sound detector 122 by manipulating the portable terminal 110.

In one or more additional example embodiments, a computer program product for executing the embodiments of methods described herein includes a computer readable computer program code stored in a computer readable recording medium. Examples of the computer readable recording medium include, but are not limited to, magnetic storing media, such as read only memory ("ROM"), floppy disks and hard disks, as well as optical readable media, such as compact-disc-ROMs ("CD-ROMs") and digital versatile discs ("DVDs").

The general inventive concept should not be construed as being limited to the embodiments set forth herein. Rather, the example embodiments described herein are provided so that this disclosure will be thorough and complete and will fully convey the concept of the general inventive concept to those of ordinary skill in the art. Descriptions of aspects within each example embodiment should be considered as available for other aspects in other example embodiments.

In addition, while the general inventive concept has been particularly shown and described herein with reference to example embodiments thereof, it will be understood by those of ordinary skill in the art that various changes in form and details may be made therein without departing from the spirit or scope of the present invention as defined by the following claims.

What is claimed is:

1. A sound detector which communicates with a portable terminal and another sound detector using a body area network (BAN), the sound detector comprising:
   a sensing unit which senses first hearable data from outside the sound detector and the portable terminal,
   a sound detector side transmitter/receiver which communicates with the portable terminal and the another sound detector and receives second hearable data and control data using a body area network (BAN) of a user according to a manipulation of the portable terminal by the user;
   a sound detector side controller which amplifies the first hearable data sensed by the sensing unit and determines a reproduction mode for reproducing at least one of the amplified first hearable data and the second hearable data according to a manipulation of the portable terminal by the user and the control data; and
   a sound detector side reproducing unit which reproduces the amplified first hearable data or the second hearable data according to the reproduction mode,
   wherein the control data comprises sound detector information, user information and hearable data edit information,
   wherein the sound detector information comprises information corresponding to an up-to-date record of previous and current operations of the sound detectors,
   wherein the user information comprises a result of a hearing test performed for the user,
   wherein the hearable data edit information comprises compensation gain corresponding to an audiogram of the user, and
   wherein the sound detector side controller adaptively updates the control data when a change of the sensed first hearable data exceeds a predetermined threshold value, and the sound detector side transmitter/receiver transmits the updated control data to the another sound detector using the body area network.

2. The sound detector of claim 1, wherein
   the sound detector side controller transmits at least one of the amplified first hearable data and the second hearable data to the sound detector side reproducing unit.

3. The sound detector of claim 1, wherein the sound detector is configured as a hearing aid.

4. The sound detector of claim 1, wherein
   the sound detector side transmitter/receiver receives the second hearable data and the control data from the portable terminal, and
   the sound detector side controller converts the amplified first hearable data or the second hearable data according to the control data to generate converted first hearable data or converted second hearable data, and
   the sound detector side reproducing unit reproduces the converted first hearable data or the converted second hearable data.

5. The sound detector of claim 1, further comprising a sound detector side storage unit.

6. The sound detector of claim 5, wherein data stored in the sound detector side storage unit is updated according to the manipulation of the portable terminal.

7. The sound detector of claim 1, wherein an operation mode of the sound detector is set according to the control data received from the portable terminal.

8. The sound detector of claim 1, wherein the sound detector is worn on an ear of the user.

9. The sound detector of claim 1, wherein the sound detector side reproducing unit reproduces the first hearable data or the second hearable data by transmitting the first hearable data or the second hearable data using one of air conduction and bone conduction.

10. A method of controlling a sound detector, the method comprising:
receiving control data, which controls the sound detector, from a portable terminal and another sound detector according to a manipulation of the portable terminal by a user by using a body area network (BAN); and
amplifying first hearable data sensed by the sound detector according to the control data;
selecting at least one of the amplified first hearable data and second hearable data, which is received from the portable terminal, based on the received control data,
wherein the selecting is performed by the sound detector,
wherein the control data comprises sound detector information, user information and hearable data edit information,
wherein the sound detector information comprises information corresponding to an up-to-date record of previous and current operations of the sound detector,
wherein the user information comprises a result of a hearing test performed for the user,
wherein the hearable data edit information comprises compensation gain corresponding to an audiogram of the user, and
wherein the control data is updated when a change of the sensed first hearable data exceeds a predetermined threshold value, and the updated control data is transmitted to the another sound detector using the body area network.

11. The method of claim 10, further comprising:
sensing the first hearable data from outside the sound detector and the portable terminal.

12. The method of claim 10, further comprising converting the amplified first hearable data or the second hearable data to be reproduced in the sound detector according to the control data.

13. A sound detector system comprising:
a first sound detector comprising:
a sound detector side controller;
a sound detector side transmitter/receiver; and
a sensing unit which senses first hearable data; and
a second sound detector, wherein
the sound detector side controller adaptively updates control data of the first sound detector when a change of the first hearable data sensed by the sensing unit exceeds a predetermined threshold value, and
the sound detector side transmitter/receiver communicates the updated control data to the second sound detector and transmits the updated control data to the another sound detector using the body area network (BAN) of a user,
wherein the control data comprises sound detector information, user information and hearable data edit information,
wherein the sound detector information comprises information corresponding to an up-to-date record of previous and current operations of the sound detector,
wherein the user information comprises a result of a hearing test performed for the user, and
wherein the hearable data edit information comprises compensation gain corresponding to an audiogram of the user.

14. The sound detector system of claim 13, wherein an operation mode of at least one of the first sound detector and the second sound detector is determined according to the control data.

15. The sound detector system of claim 13, wherein the first sound detector further comprises a sound detector side reproducing unit which reproduces the first hearable data sensed by the sensing unit.

16. The sound detector system of claim 15, wherein
the sound detector side controller converts the amplified first hearable data or the second hearable data according to the updated control data to generate converted first hearable data or converted second hearable data, and
the sound detector side reproducing unit reproduces the converted first hearable data or the converted second hearable data.

17. A method of controlling data of a sound detector comprising a first sound detector and a second sound detector, the method comprising:
sensing first hearable data from outside the first sound detector and the second sound detector to generate sensed first hearable data;
adaptively updating control data of the first sound detector when a change of the sensed first hearable data exceeds a predetermined threshold value; and
transmitting the updated control data to the second sound detector using the body area network (BAN) of a user,
wherein the control data comprises sound detector information, user information and hearable data edit information,
wherein the sound detector information comprises information corresponding to an up-to-date record of previous and current operations of the sound detector,
wherein the user information comprises a result of a hearing test performed for the user, and
wherein the hearable data edit information comprises compensation gain corresponding to an audiogram of the user.

18. The method of claim 17, wherein an operation mode of the first sound detector is determined according to the control data.

19. The method of claim 17, wherein an operation mode of the second sound detector is determined according to the updated control data.

20. The method of claim 17, further comprising reproducing the sensed first hearable data.

21. The method of claim 17, wherein the reproducing the sensed first hearable data comprises:
converting the sensed and amplified first hearable data according to the updated control data to generate converted first hearable data; and
reproducing the converted first hearable data.

22. A method of determining hearable data reproduced in a sound detector which communicates with a portable terminal and another sound detector using body area network (BAN), the method comprising:
sensing first hearable data in the sound detector from outside of the sound detector;
receiving second hearable data previously stored in the portable terminal and control data, which controls the sound detector, from the portable terminal; and determining a reproduction mode for reproducing at least one of the amplified first hearable data and the second hearable data in response to a manipulation of the portable terminal by a user, wherein the control data comprises sound detector information, user information and hearable data edit information, wherein the sound detector information comprises information corresponding to an up-to-date record of previous and current operations of the sound detector, wherein the user information comprises a result of a hearing test performed for the user, wherein the hearable data edit information comprises compensation gain corresponding to an audiogram of the user, and wherein the control data is adaptively updated when a change of the sensed first hearable data exceeds a predetermined threshold value and the updated control data is transmitted from the another sound detector to the sound detector using body area network.

23. The method of claim 22, wherein the reproduction mode comprises one selected from the group consisting of a mode for reproducing the first hearable data, a mode for reproducing the second hearable data, and a mode for simultaneously reproducing the first hearable data and the second hearable data.

24. The method of claim 22, wherein the reproduction mode is determined based on predetermined rules.

25. The method of claim 22, wherein when the reproduction mode is the mode in which the first hearable data and the second hearable data are simultaneously reproduced, setting information for reproducing each of the first hearable data and the second hearable data is further determined.

26. The method of claim 22, wherein the reproduction mode is determined in the portable terminal, and
wherein the receiving the second hearable data and the control data comprises receiving the second hearable data and the control data according to the reproduction mode determined in the portable terminal.

27. The method of claim 26, wherein the receiving is performed by using a body area network (BAN).

28. The method of claim 26, wherein the reproduction mode is determined in the sound detector, and
wherein the receiving the second hearable data comprises receiving the second hearable data, if the second hearable data is reproduced in the sound detector according to the determined reproduction mode.

29. The method of claim 28, wherein the receiving is performed by using a body area network (BAN).

30. The method of claim 22, further comprising reproducing at least one of the first hearable data and the second hearable data in the sound detector according to the determined reproduction mode.

31. A non-transitory computer readable recording medium having stored thereon a computer program for executing any one of the methods of claims 10, 17, and 22.

32. A sound reproducing system comprising:
a sound detector for sensing and amplifying first hearable data from outside, wherein the sound detector communicates with a portable terminal and another sound detector using a body area network (BAN); and
a portable terminal for determining a reproduction mode for reproducing at least one of the amplified first hearable data and second hearable data previously stored in the portable terminal or received in correspondence to manipulation of the portable terminal by a user and transmitting control data according to the determined reproduction mode to the sound detector by using a body area network (BAN), wherein the sound detector reproduces at least one of the amplified first hearable data and the second hearable data by referring to the control data received in the sound detector, wherein the control data comprises sound detector information, user information and hearable data edit information, wherein the sound detector information comprises information corresponding to an up-to-date record of previous and current operations of the sound detector, wherein the user information comprises a result of a hearing test performed for the user, wherein the hearable data edit information comprises compensation gain corresponding to an audiogram of the user, and wherein the control data is adaptively updated when a change of the sensed first hearable data exceeds a predetermined threshold value and the updated control data is transmitted from the another sound detector to the sound detector using body area network.

* * * * *